United States Patent
Hsin et al.

(10) Patent No.: US 6,498,106 B1
(45) Date of Patent: Dec. 24, 2002

(54) PREVENTION OF DEFECTS FORMED IN PHOTORESIST DURING WET ETCHING

(75) Inventors: Pin-Yi Hsin, Chu-Bet (TW); Yu-Lun Lin, Taipei (TW); Jyh-Shiou Hsu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 96 days.

(21) Appl. No.: 09/845,478

(22) Filed: Apr. 30, 2001

(51) Int. Cl.[7] ............. H01L 21/302; H01L 21/311; H01L 21/312
(52) U.S. Cl. .......... 438/704; 438/706; 438/725; 438/745; 252/79.1; 252/79.2
(58) Field of Search ............... 438/706, 745, 438/704, 725; 252/79.1, 79.2

(56) References Cited

U.S. PATENT DOCUMENTS

| | | | |
|---|---|---|---|
| 4,241,165 A | * 12/1980 | Hughes et al. | 430/269 |
| 4,296,146 A | * 10/1981 | Penn | 427/58 |
| 5,668,035 A | 9/1997 | Fang et al. | 438/239 |
| 5,674,357 A | * 10/1997 | Sun et al. | 156/659.11 |
| 5,980,768 A | * 11/1999 | Abraham | 216/67 |
| 6,107,134 A | * 8/2000 | Lu et al. | 438/239 |
| 6,146,795 A | 11/2000 | Huang et al. | 430/30 |

* cited by examiner

Primary Examiner—Benjamin L. Utech
Assistant Examiner—Lynette T. Umez-Eronini
(74) Attorney, Agent, or Firm—George O. Saile; Stephen B. Ackerman

(57) ABSTRACT

An undesirable side effect of some processes that are used for forming dual gate devices is the formation of defects at the interface between the two oxide layers of different thickness. This problem has been solved by preceding the HF wet dip (that is used to thin out a selected area of oxide) with exposure of the photoresist to a low power plasma that includes some oxygen. This treatment removes unsaturated chemical bonds from the resist surface and prevents the formation of SiC based defects. Such defects could cause polysilicon lines to short or open, depending on their size.

14 Claims, 2 Drawing Sheets

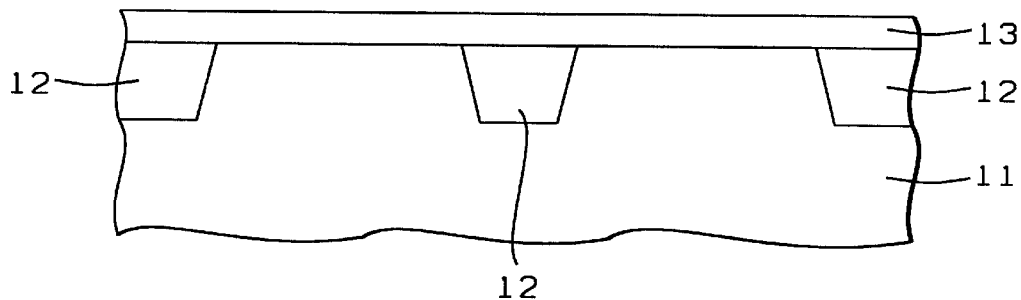
FIG. 1 – Prior Art
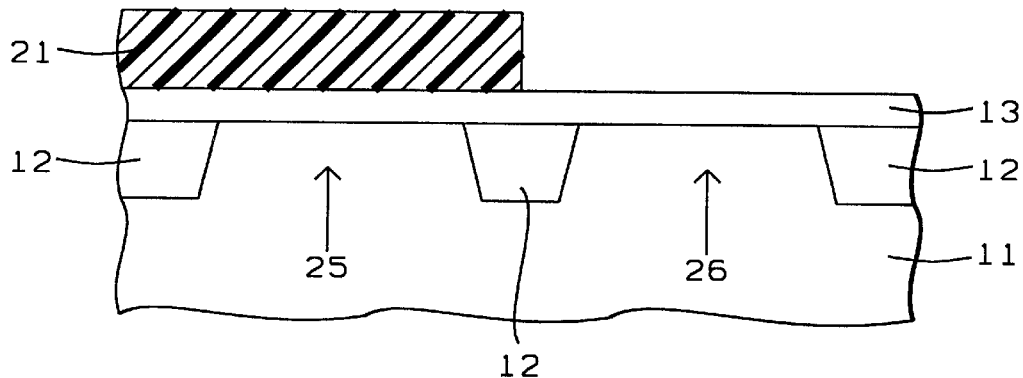
FIG. 2 – Prior Art
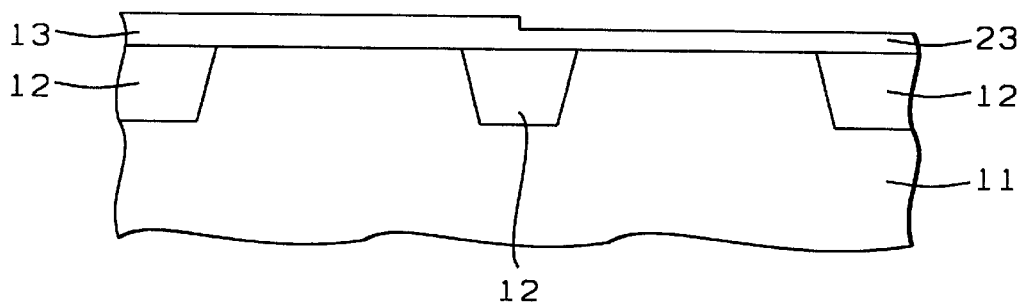
FIG. 3

PREVENTION OF DEFECTS FORMED IN PHOTORESIST DURING WET ETCHING

FIELD OF THE INVENTION

The invention relates to the general field of integrated circuits with particular reference to photolithography.

BACKGROUND OF THE INVENTION

It is often the case in current integrated circuit technology that there will be two field effect transistors (FETs) that are situated close to one another but, because they will be used to perform different functions (e.g. one might be part of a logic circuit while the other is part of a memory array) the thicknesses of their gate oxides will not be the same. There are several approaches to manufacturing such dual gate structures. The approach used as part of the present invention is to start with a substrate, such as a silicon wafer 11, as illustrated in FIG. 1, and form shallow isolation trenches 12 in the surface, the intent being to form one FET per inter-trench space.

Accordingly, oxide layer 13 is first formed on the surface following which those portions that are to be used for the thicker oxide devices are protected by photoresist mask 21 (FIG. 2). The next step is to then etch the unprotected portions of oxide layer 13 so as to reduce its thickness there. An important aspect of the process is that the step that follows, which is the routine removal of photoresist mask 21, is performed using a wet strip process instead of the more usual plasma dry ashing process. This is to prevent damage to the dual gate oxide by the high energy plasma that is part of the ashing process.

The intent of the of the above-described process is to form the structure shown in FIG. 3. Unfortunately, it has been found that there is often an undesirable side effect which we have illustrated schematically in FIG. 4. Shown there is defect 44 that appears at the interface between the two thicknesses of oxide, 23 and 13. 44 is a particle of silicon carbide (SiC) that can form due to unsaturated bonds on the photoresist surface, at the edge of the photoresist pattern, that will react with SiF6 during the wet etch process.

These SiC defects stay on the wafer surface after the wet strip process, and can cause shorts or opens of the poly lines, depending on their size. The present invention discloses a process for ensuring that said SiC defects do not form.

A routine search of the prior art was performed with the following references of interest being found:

A process for forming a dual gate dielectric is described by Fang et al. in U.S. Pat. No. 5,588,035. In U.S. Pat. No. 6,146,795, Huang et al. form two oxide layers of different thicknesses by first forming a single oxide layer all over, removing the oxide from one area, and then performing a second oxidation step all over. The problem to which they provide a solution is how to ensure that there is no residual photoresist left behind prior to initiating the second oxidation step. The process that they disclose is the use of a low power plasma etch done in combination with X-ray spectroscopy (to detect carbon) to ensure that all photoresist is removed while at the same time not damaging the oxide that has been left in place.

SUMMARY OF THE INVENTION

It has been an object of the present invention to provide a process for the formation of dual gate devices having different gate oxide thicknesses.

Another object of the invention has been that no defects get formed at the interface between the two different gate oxide thicknesses.

Still another object has been to remove unsaturated chemical bonds from the edge of the photoresist mask that is used in the process.

These objects have been achieved by preceding the HF wet dip (that is used to thin out the oxide) with exposure of the photoresist to a low power plasma that includes some oxygen. This treatment removes unsaturated chemical bonds from the resist surface and prevents the formation of SiC based defects. Such defects could cause polysilicon lines to short or open, depending on their size.

BRIEF DESCRIPTION OF THE DRAWINGS

FIG. 1 shows a silicon wafer including shallow trenches for isolation.

FIG. 2 shows a portion of FIG. 1 masked off with photoresist.

FIG. 3 shows FIG. 2 after part of the oxide surface has had its thickness reduced.

DESCRIPTION OF THE PREFERRED EMBODIMENTS

Figure 4:
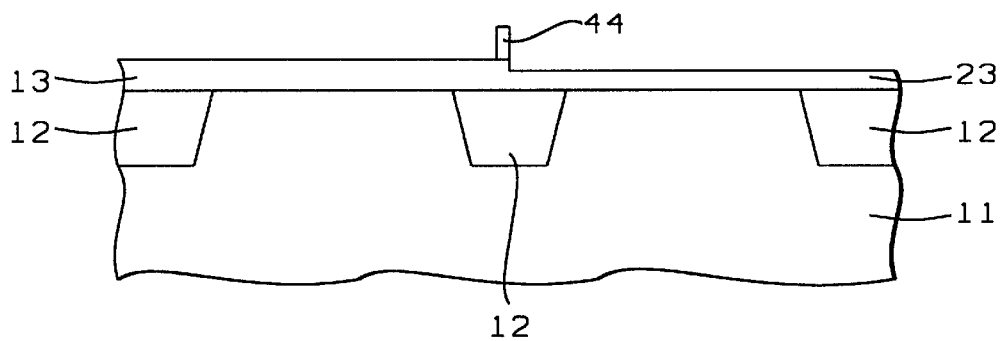
FIG. 4 shows how a defect can form at the site of the original photoresist edge.

We will describe the process of the present invention in terms of forming dual gates within a silicon integrated circuit but it will be understood that the process is of a more general nature and could be applied to other situations where adjacent oxides of differing thicknesses are to be formed.

The process of the present invention begins with the provision of a silicon wafer such as wafer 11 which was already seen in FIG. 1. Shallow trenches 12 that are filled with insulation are then formed in the upper surface of 11. This is accomplished by first etching open trenches that have a depth of between about 2,000 and 4,500 Angstroms, then overfilling these trenches with insulating material, and then removing excess insulating material by means of chemical mechanical polishing. Following this, oxide layer 13 is formed. Then, as shown in FIG. 2, photoresist mask 21 is formed through conventional photolithographic means and serves to protect a first area 25, which is located between two of the trenches, while leaving a second area 26, that is between two adjacent trenches, unprotected.

Figure 5:
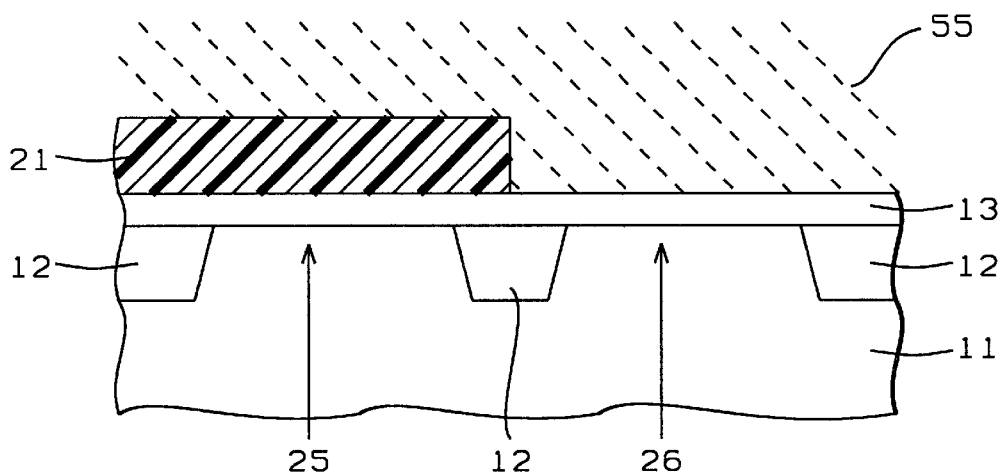
FIG. 5 illustrates a key feature of the invention—exposure to a low power plasma.

Now follows an extra step which is the key feature of the present invention. This is exposing the photoresist layer to gas plasma 55 (in FIG. 5), at a pressure between about 0.95 and 1.15 torr, containing at least 95 percent oxygen by volume, at a power level that is less than about 300 watts, for between about 5 and 20 seconds. In addition to oxygen, the gas plasma could include additional gases such as argon and nitrogen, The introduction of this critical step into an otherwise standard process results in the removal of unsaturated chemical bonds from the photoresist surface. It should be noted that this is not an etching step since no photoresist is removed, only its surface structure being altered.

Following the surface treatment provided by the low energy plasma, the unprotected gate oxide in area 26 is etched until its thickness has been reduced by the intended amount. Typically layer 13 will be formed to a thickness between about 50 and 150 Angstroms, and its thickness reduced to be between about 20 and 80 Angstroms where it has been thinned down to become layer 23. Removal of the unprotected silicon oxide is achieved by etching in HF for between about 50 and 80 seconds at a temperature between about 22 and 23° C.

Then, layer,of photoresist 21 is removed by means of a wet etch treatment which comprises etching in SPM (Sulfuric acid-hydrogen Peroxide Mixture) for between about 20 and 40 minutes at a temperature between about 160 and 170° C.

Figure 6:
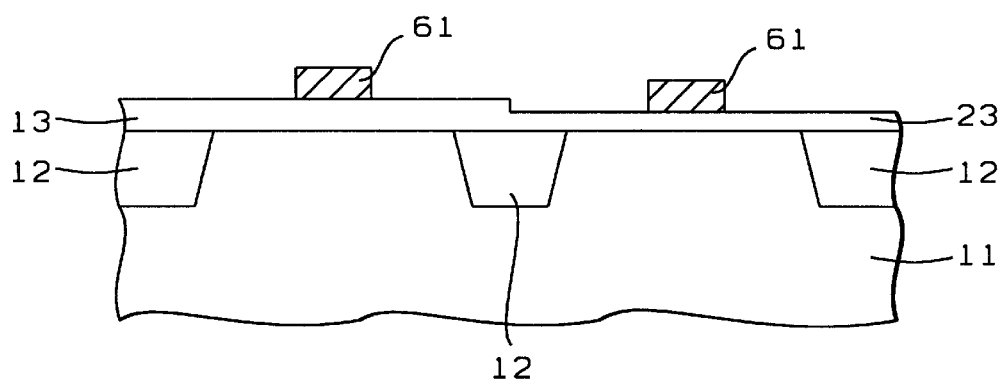
FIG. 6 shows the structure obtained at the conclusion of the process of the present invention.

The process of the present invention concludes by coating both areas (25 and 26) with a polysilicon layer which is deposited to a thickness between about 1,500 and 3,000 Angstroms and then patterned and etched to form polysilicon gate pedestals 61 (one each per area) as shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A process for etching a dual thickness oxide, comprising:

providing a substrate on which is a layer of silicon oxide having a first thickness;

coating the silicon oxide layer with a layer of photoresist, having a surface, and then patterning said photoresist layer to protect a part of said silicon oxide layer;

exposing the photoresist layer to a gas plasma, at a pressure between about 0.95 and 1.15 torr, containing at least 95 percent oxygen by volume, at a power level that is less than about 300 watts, for between about 5 and 15 seconds, thereby removing unsaturated chemical bonds from the photoresist surface without etching the photoresist;

etching all unprotected silicon oxide thereby reducing it to a second thickness; and then removing the layer of photoresist by means of a wet etch treatment.

2. The process of claim 1 wherein said first thickness is between about 50 and 150 Angstroms.

3. The process of claim 1 wherein said second thickness is between about 20 and 80 Angstroms.

4. The process of claim 1 wherein the gas plasma further comprises additional gases selected from the group consisting of argon and nitrogen.

5. The process of claim 1 wherein the step of etching all unprotected silicon oxide further comprises etching in HF for between about 60 and 80 seconds at a temperature between about 22 and 23° C.

6. The process of claim 1 wherein the step of removing the layer of photoresist by means of a wet etch treatment further comprises etching in SPM for between about 20 and 40 minutes at a temperature between about 160 and 170° C.

7. A process for etching part of a dual gate structure, comprising:

providing a silicon wafer having an upper surface;

in said upper surface, forming shallow trenches that are filled with insulation;

defining first and second areas, each of which is located between two of the trenches and that are separated from one another by one of the trenches;

for both areas, forming on said upper surface a layer of gate oxide having a first thickness;

coating the gate oxide layer with a layer of photoresist, having a surface, and then patterning said photoresist layer so that the first area is protected by photoresist and the second area is unprotected;

exposing the photoresist layer to a gas plasma, at a pressure between about 0.95 and 1.15 torr, containing at least 95 percent oxygen by volume, at a power level that is less than about 300 watts, for between about 5 and 15 seconds, thereby removing unsaturated chemical bonds from the photoresist surface without etching the photoresist;

etching the unprotected gate oxide in the second area until it has a reduced second thickness;

removing the layer of photoresist by means of a wet etch treatment;

coating said first and second areas with a layer of polysilicon; and patterning and etching the polysilicon layer to define one gate pedestal for each area.

8. The process of claim 7 wherein said first thickness is between about 50 and 150 Angstroms.

9. The process of claim 7 wherein said second thickness is between about 20 and 80 Angstroms.

10. The process of claim 7 wherein the gas plasma further comprises additional gases selected from the group consisting of argon and nitrogen.

11. The process of claim 7 wherein the step of etching all unprotected silicon oxide further comprises etching in HF for between about 60 and 80 minutes at a temperature between about 22 and 23° C.

12. The process of claim 7 wherein the step of removing the layer of photoresist by means of a wet etch treatment further comprises etching in SPM for between about 20 and 40 minutes at a temperature between about 160 and 170° C.

13. The process of claim 7 wherein the step of forming shallow trenches further comprises etching open trenches that have a depth of between about 3,000 and 4,500 Angstroms, overfilling the trenches with insulating material, and then removing excess insulating material by means of chemical mechanical polishing.

14. The process of claim 7 wherein said polysilicon layer is deposited to a thickness between about 1,500 and 3,000 microns.

* * * * *